United States Patent
Lau et al.

(10) Patent No.: US 10,121,723 B1
(45) Date of Patent: Nov. 6, 2018

(54) SEMICONDUCTOR COMPONENT AND METHOD FOR PRODUCING A SEMICONDUCTOR COMPONENT

(71) Applicant: Infineon Technologies Austria AG, Villach (AT)

(72) Inventors: Kok Tee Lau, Melaka (MY); Jayaganasan Narayanasamy, Melaka (MY)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 15/486,907

(22) Filed: Apr. 13, 2017

(51) Int. Cl.
*H01L 23/373* (2006.01)
*H01L 21/48* (2006.01)
*H01L 23/367* (2006.01)

(52) U.S. Cl.
CPC ...... *H01L 23/3731* (2013.01); *H01L 21/4882* (2013.01); *H01L 23/3672* (2013.01)

(58) Field of Classification Search
CPC .............. H01L 23/3731; H01L 23/3672; H01L 21/4882
See application file for complete search history.

(56) References Cited

U.S. PATENT DOCUMENTS

| | | | | |
|---|---|---|---|---|
| 5,604,978 A * | 2/1997 | Sherif | ................. | H01L 23/3737 257/707 |
| 5,945,217 A * | 8/1999 | Hanrahan | ........... | H01L 23/4275 165/104.17 |
| 6,160,042 A * | 12/2000 | Ishida | ...................... | C08K 9/04 423/290 |
| 7,013,965 B2 * | 3/2006 | Zhong | ...................... | C09K 5/14 165/185 |
| 7,550,097 B2 * | 6/2009 | Tonapi | ..................... | C09K 5/14 106/1.18 |
| 8,169,767 B2 * | 5/2012 | Pruss | .................... | C01B 21/064 361/226 |
| 8,587,945 B1 * | 11/2013 | Hartmann | .......... | H05K 7/20454 361/679.53 |
| 9,240,364 B2 * | 1/2016 | Park | ....................... | H01L 23/36 |
| 9,303,327 B2 * | 4/2016 | Yeong | .................... | C25D 13/12 |
| 9,316,382 B2 * | 4/2016 | Rowlette | ............. | F21V 19/0035 |
| 9,656,868 B2 * | 5/2017 | Nishi | .................... | C01B 21/064 |
| 2005/0045855 A1 * | 3/2005 | Tonapi | ..................... | C09K 5/14 252/500 |
| 2005/0127134 A1 | 6/2005 | Lu et al. | | |
| 2016/0169598 A1 * | 6/2016 | Semenic | ............... | F28F 13/003 165/185 |

(Continued)

OTHER PUBLICATIONS

Berger, L.I., "Dielectric Strength of Insulating Materials," L.I. Berger, CRC Press LLC. https://chemistry.mdma.ch/hiveboard/rhodium/pdf/chemical-data/diel_strength.pdf, 5 pages, printed Mar. 2018.

(Continued)

*Primary Examiner* — William Coleman
(74) *Attorney, Agent, or Firm* — Slater Matsil, LLP (57) ABSTRACT

According to an embodiment of a method, the method includes forming a first thermally conductive layer on an outer surface of a semiconductor package. The first thermally conductive layer formed on the outer surface of the semiconductor package is configured to be mounted to an external heat sink.

21 Claims, 4 Drawing Sheets

(56) References Cited

U.S. PATENT DOCUMENTS

2017/0117208 A1* 4/2017 Kasztelan ........... H01L 23/4952

OTHER PUBLICATIONS

Besra, Laxmidhar, A. et al., "A review of fundamentals and applications of electrophoretic deposition (EPD)," ScienceDirect, Progress in Materials Science, vol. 52, Issue 1, https://doi.org/10.1016/j.pmatsci.2006.07.001, Jan. 2007, pp. 1-61.
Goodfellow Ceramic Property Tables, http://www.goodfellowusa.com/pdf/TAB601X.pdf, Oct. 31, 2008, 10 pages.
Tanaka, Toshikastu et al., "Toward High Thermal Conductivity Nano Micro Epoxy Composites with Sufficient Endurance Voltage," Journal of International Council on Electrical Engineering, vol. 2, No. 1, pp. 90-98, 2012.
Winter, Mark, WebElements, Silicon: Silicon oxide http://www.webelements.com/compounds/silicon/silicon_dioxide.html, The University of Sheffield, UK, 1993-2016, printed Mar. 2018. 2 pages.

\* cited by examiner

SEMICONDUCTOR COMPONENT AND METHOD FOR PRODUCING A SEMICONDUCTOR COMPONENT

TECHNICAL FIELD

This disclosure in general relates to a semiconductor component and a method for producing a semiconductor component, in particular a semiconductor component comprising means for attaching the semiconductor component to a heat sink.

BACKGROUND

Semiconductor components are usually packaged and then mounted to a printed circuit board. The semiconductor components may further be coupled to a heat sink, wherein the heat sink is configured to dissipate heat produced by the semiconductor component. Several different ways are known of how a semiconductor component may be mounted to a heat sink. Such mounting methods, however, are often expensive, require a lot of space, and require one or more additional process steps for mounting the component to the heat sink. There is a need to provide a semiconductor component that may be easily mounted to another component, such as a heat sink, at reduced costs and with reduced effort.

SUMMARY

One example relates to a method. The method includes forming a first thermally conductive layer on an outer surface of a semiconductor package. The first thermally conductive layer formed on the outer surface of the semiconductor package is configured to be mounted to an external heat sink.

Another example relates to a semiconductor component. The semiconductor component includes a semiconductor package with an outer surface and a first thermally conductive layer arranged on the outer surface of the semiconductor package. The semiconductor component with the first thermally conductive layer arranged thereon is configured to be mounted to an external heat sink such that the first thermally conductive layer faces the heat sink Those skilled in the art will recognize additional features and advantages upon reading the following detailed description, and on viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIG. 10, including FIGS. 10A-10C, schematically illustrates one example of a method for producing a semiconductor component.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
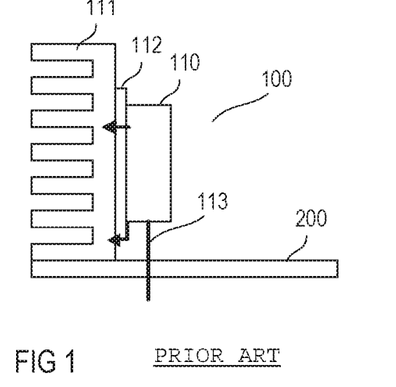
FIG. 1 schematically illustrates a side view of a semiconductor component that is mounted to a heat sink.

Several methods are known for mounting a semiconductor component to a second component such as a heat sink, for example. Attaching semiconductor components to heat sinks removes the waste heat that is generated during operation of the semiconductor components. FIG. 1 shows one known possibility for attaching a semiconductor component 100 to a heat sink 111. The semiconductor component 100 comprises a package 110. One or more semiconductor dies (not illustrated in FIG. 1) may be arranged within the semiconductor package 110. The package 110 may comprise one or more pins or leads 113 for mounting the semiconductor component 100 to a printed circuit board 200 and for providing an electrical connection between the semiconductor die(s) in the package 110 and the surrounding circuitry (e.g., on the printed circuit board 200). The semiconductor component 100 is further coupled to a heat sink 111. An isolation foil 112 is arranged between the semiconductor component 100 and the heat sink 111. The isolation foil 112 is configured to dissipate heat from the semiconductor component 100 to the heat sink 111. The use of isolation foils 112, however, is usually rather expensive. A further drawback of isolation foils 112 is that additional process steps are required. This is because the semiconductor component 100, the heat sink 111 and the isolation foil 112 have to be purchased separately and subsequently have to be assembled by an end user. The isolation foil 112 is first laminated to the heat sink 111 and then the semiconductor component 100 is attached to the isolation foil 112. The isolation foil 112 may be a ceramic foil, for example. The isolation foil 112 generally may be electrically non-conductive and thermally conductive.

Figure 2:
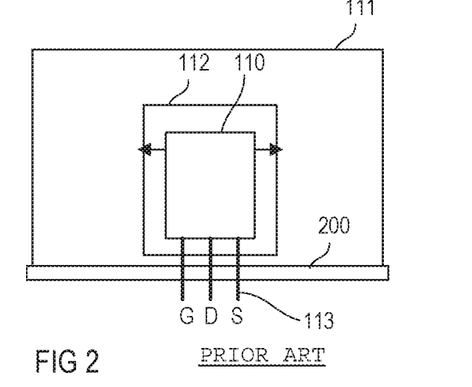
FIG. 2 schematically illustrates a top view of the semiconductor component and heat sink of FIG. 1.

Generally, the creepage distances in the arrangement in FIG. 1 are rather large. This is schematically illustrated in FIG. 2 which illustrates a top view of the arrangement of FIG. 1. The creepage distances are schematically indicated by arrows in FIGS. 1 and 2.

Figure 3:
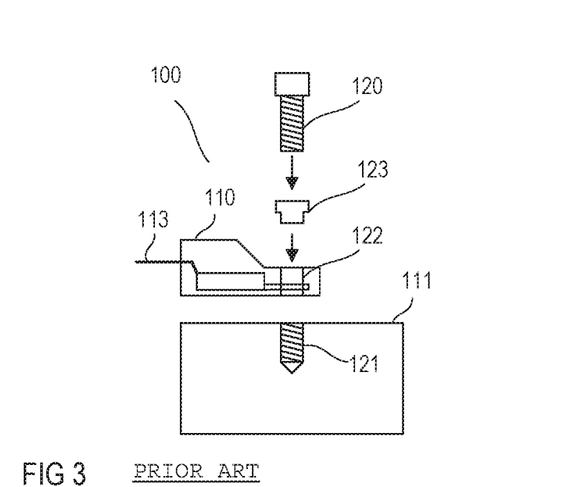
FIG. 3 schematically illustrates a side view of a semiconductor component that is mountable to a heat sink by means of a screw.

FIG. 3 illustrates another example of a known method for mounting a semiconductor component 100 to a heat sink 111. In the example of FIG. 3, the heat sink 111 and the semiconductor component 100 each comprise a hole 121, 122. A screw 120 may be inserted into the holes 121, 122 to fix the semiconductor component 100 to the heat sink 111. A compression washer 123 may be inserted between the screw 120 and the semiconductor component 100. This method, however, also has several drawbacks. For example, the thermal conductivity depends on a filler material (usually Silicon) that acts as a thermal dissipator and the resulting Silicon/Resin ratio is usually limited/balanced by the moldability performance. Other mechanical fasteners are known for attaching a semiconductor component 100 to a heat sink 111, including nuts and bolts or spring clips with either greased mica or thermally-enhanced silicone pads, for example.

Figure 4:
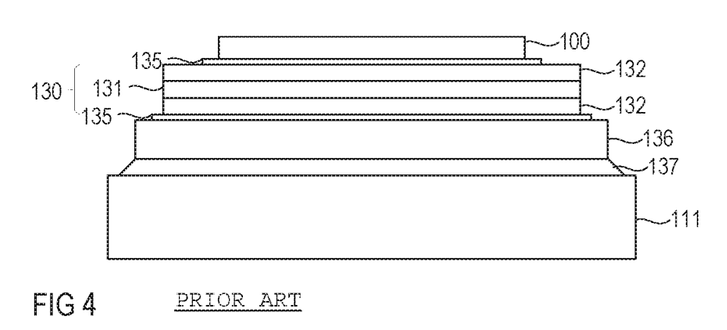
FIG. 4 schematically illustrates a semiconductor component that is mounted to a heat sink by means of direct copper bonding.

A further known method is illustrated in FIG. 4. The semiconductor component 100 is mounted on a substrate 130, in particular a direct copper bonded (DCB) substrate 130. The DCB substrate comprises a ceramic dielectric insulator layer 131. Pure copper layers 132 are applied and bonded to the ceramic layer 131 on both sides using great adhesive strength in a high temperature melting and diffusion process. The semiconductor component 100 is then soldered to a first side of the DCB substrate 130 using a solder layer 135. The heat sink 111 may be coupled to the second side of the DCB substrate 130 opposite the first surface. A heat spreader 136 may be inserted between the DCB substrate 130 and the heat sink 111. For example, the DCB substrate 130 may be soldered to the heat spreader 136 by means of a solder layer 135. A thermal grease layer 137 may be arranged between the heat spreader 136 and the heat sink 111.

The heat spreader 136 may be a copper baseplate or aluminium baseplate. However, especially in the lower power range, arrangements without a baseplate are also frequently used. In such an arrangement the second solder layer 135 and heat spreader 136 may be omitted and the DCB substrate 130 may be coupled to the heat sink 111 via the thermal grease layer 137. Even though an arrangement including a DCB substrate 130 has several advantages such as a high mechanical strength and mechanical stability, good adhesion and corrosion resistance, and a very good thermal conductivity, it also has some drawbacks. The drawbacks include high costs. Furthermore, several additional process steps are required during assembly of the arrangement and the isolation is rather thick (e.g., minimum of 250 μm).

Figure 5:
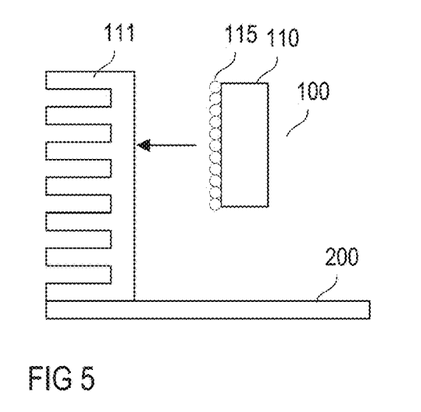
FIG. 5 schematically illustrates a side view of an example embodiment of a semiconductor component that is configured to be mounted to a heat sink.

FIG. 5 illustrates a first exemplary embodiment of a semiconductor component 100 according to the present invention. The semiconductor component 100 comprises a semiconductor package 110. A first thermally conductive layer 115 is arranged on an outer surface of the semiconductor package 110. The first thermally conductive layer 115 formed on the outer surface of the semiconductor package is configured to be mounted to an external heat sink 111. Correspondingly, the semiconductor component 100 with the first thermally conductive layer 115 arranged on the outer surface of the semiconductor component 110 is configured to be mounted to an external heat sink 111 such that the first thermally conductive layer 115 faces the heat sink 111.

A method for producing a semiconductor component 100 comprises forming a first thermally conductive layer 115 on an outer surface of a semiconductor package 110. The first thermally conductive layer 115 formed on the outer surface of the semiconductor package 110 is configured to be mounted to an external heat sink 111.

Figure 11:
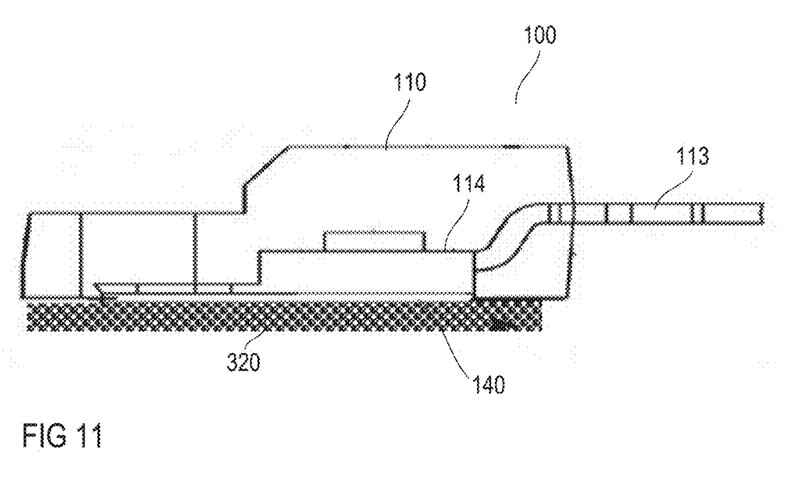
FIG. 11 schematically illustrates a semiconductor component according to one example.

In one example, the semiconductor component 100 includes at least one semiconductor die 114 (see Figure ii) that is arranged within the semiconductor package 110. The first thermally conductive layer 115 may be arranged on a first outer surface or external surface of the semiconductor package 110. The first outer surface of the semiconductor package no may comprise an electrically conductive surface 140 such as a heat sink or exposed die pad (see Figure ii), for example. The electrically conductive surface 140 may comprise an electrically conductive material such as a metal, for example. The semiconductor package 110 may comprise a casing made of plastic, glass or ceramic, for example. The casing may comprise an opening on one side, e.g. bottom side or top side. The electrically conductive surface 140 may be arranged within this opening such that it forms a part of the respective outer surface of the semiconductor package 110.

The semiconductor component 100 may comprise pins or leads 113 (see Figure ii) for mounting the semiconductor component 110 to a printed circuit board (PCB) or a DCB 200, for example. The pins or leads 113 may be inserted in through holes of a PCB or may be surface mounted to a PCB, for example. The electrically conductive surface 140 of the semiconductor component 100 may be thermally coupled to an external heat sink 111 by means of the first thermally conductive layer 115. This means that the first thermally conductive layer 115 is arranged between the semiconductor component 100 and the external heat sink 111. The external heat sink 111 may comprise a thermally conductive material and is configured to dissipate heat from the semiconductor component 100. The external heat sink 111 may comprise fins, as is illustrated in FIG. 5, to increase the surface area of the external heat sink 111. In this way, more heat may be delivered to a surrounding medium such as air, or any other suitable cooling fluid (not illustrated in FIG. 5). A heat sink 111 comprising fins, however, is only an example.

The first thermally conductive layer 115 is formed on the semiconductor package 110 before the package 110 is mounted to the external heat sink 111, in particular before the semiconductor component 100 is sold to a final customer. The thermally conductive layer 115, together with the semiconductor component 100, may then be mounted to an external heat sink in such that the thermally conductive layer faces the external heat sink 111 and is arranged between the semiconductor component 100 and the external heat sink 111.

The first thermally conductive layer 115 may comprise a ceramic material, for example. However, any other materials may be used, for example any materials providing sufficient electrical isolation and good thermal conductivity. As the first thermally conductive layer 115 is formed on the semiconductor component 100 before the semiconductor component 100 is delivered to the end customer, the mounting process for the end customer becomes much more convenient. The end customer only needs to purchase the semiconductor component 100 with the thermally conductive layer 115 already applied thereon. No further elements need to be purchased, such as separate isolation foils, screws or heat spreaders, for example. The end customer can easily mount the semiconductor component 100 to the external heat sink 111.

The semiconductor package 110 in the example of FIG. 5 may be a so-called TO-220 package. This is, however, only an example. Any other packages having an electrically conductive surface such as an exposed heat sink or exposed die pad, for example, arranged at an outer surface of the semiconductor package 110 are generally suitable such as DPAK or split leadframe packages, for example.

According to one example, a method comprises forming a first thermally conductive layer 115 on an outer surface of the semiconductor package 110. The thermally conductive layer 115 is formed before mounting the semiconductor package 110 to an external heat sink 111. The thermally conductive layer 115 formed on the semiconductor package 110 is configured to be mounted to an external heat sink 111.

Figure 6:
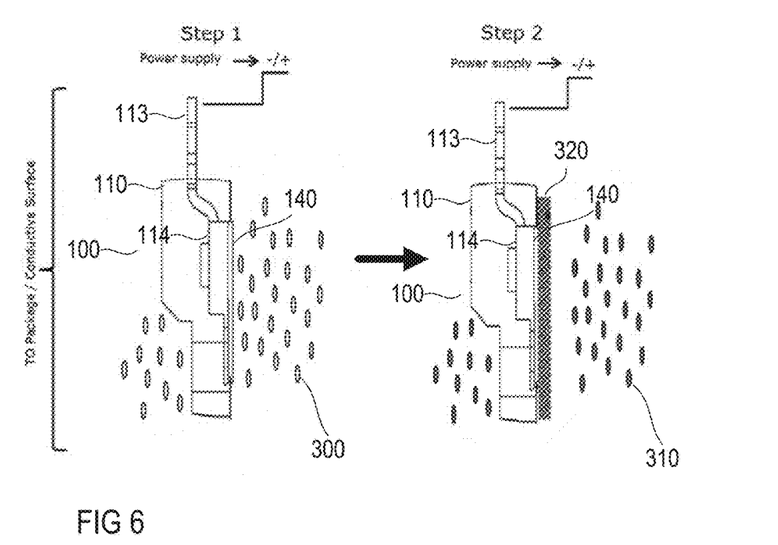
FIG. 6 schematically illustrates a method for producing a semiconductor component according to one example of the present invention.

FIG. 6 illustrates a further example of a method for producing a semiconductor component 100. The method may comprise two successive steps, for example. In a first step, a first material 300 may be deposited on the electrically conductive surface (e.g., heat sink or exposed die pad) 140 of the semiconductor package 110. The first material 300 may be or may include boron nitride, in particular hexagonal boron nitride, for example. The first material 300 may be a ceramic based material and may include an oxide or nitride combination. The first material 300 may include aluminium oxide, silicon carbide or silicon dioxide, for example. The first material 300 (e.g., the boron nitride) may be provided in the form of droplets or platelets, for example. The first step may comprise an electrophoretic deposition process, for example. Electrophoretic deposition (EPD) is a term used for a broad range of industrial processes including electrocoating, cathodic electrodeposition, anodic electrodeposition, electrophoretic coating and electrophoretic painting, for example. A characteristic feature of this process is that colloidal particles suspended in a liquid medium migrate under the influence of an electric field (electrophoresis) and are deposited onto an electrode. Generally, all colloidal particles that can be used to form stable suspensions and that can carry a charge can be used in an electrophoretic deposition process. This includes materials such as polymers, pigments, dyes, ceramics and metals, for example.

The semiconductor package 110 has a semiconductor die 114 arranged inside. An electrically conductive surface (e.g., heat sink or exposed die pad) 140 at least partially forms one of the outer surfaces of the semiconductor package 110. The electrically conductive surface 140 is electrically coupled to at least one pin or lead 113. The at least one pin or lead 113 is configured to electrically contact the semiconductor die 114 within the semiconductor package no and to electrically couple the semiconductor die 114 to any surrounding circuitry and any other components that may be arranged on the same printed circuit board, for example. The electrical connection between the pin or lead 113 and the electrically conductive surface 140 may be formed via the semiconductor die 114 within the semiconductor package 110.

The at least one pin or lead 113 may be coupled to a power supply so as to apply a direct current to the electrically conductive surface 140 of the semiconductor package 110. In one example, a voltage of between 1 and 1000V is applied to the electrically conductive surface 140. The semiconductor component 100 may be submerged into a container or vessel, for example, which holds the coating bath or solution. One or more so-called counter-electrodes may be used to complete the circuit (not illustrated in FIG. 6).

Figure 7:
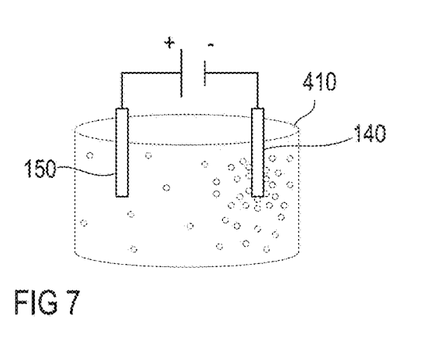
FIG. 7 exemplarily illustrates an arrangement for electrophoretic deposition.

The general principle of an arrangement for electrophoretic deposition is schematically illustrated in FIG. 7. The arrangement comprises a container or vessel 410. A coating bath or solution is held in the container or vessel 410. The electrically conductive surface 140 that is to be coated as well as at least one counter-electrode 150, are immersed into the coating bath or solution within the container 410. The electrically conductive surface 140 and the counter-electrode 150 are each connected to terminals, namely a terminal for providing a positive potential and a terminal for providing a negative potential, respectively. For example, if the electrically conductive surface 140 is coupled to a terminal for a negative potential (−), the counter-electrode 150 is coupled to a terminal for a positive potential (+), as is illustrated in FIG. 7, or vice versa. During the EPD process, a direct current is applied to the electrically conductive surface 140 and to the counter-electrode iso, and, therefore, also to the solution or colloidal suspension within the container 410. The solution or colloidal suspension may comprise ionizable groups.

There are generally two different types of E102PD processes, namely anodic and cathodic. In the anodic process, negatively charged material is deposited on the positively charged electrode, or anode. In the cathodic process, positively charged material is deposited on the negatively charged electrode, or cathode. When an electric field is applied, the charged particles within the solution or suspension migrate by the process of electrophoresis towards the electrode with the opposite charge. There are several mechanisms by which the material can be deposited on the electrode, including charge destruction and the resultant decrease in solubility, concentration coagulation, and salting out, for example. Such EPD processes are generally known in the art and will not be described in further detail herein. The so-called dipping-method of FIG. 7 is further exemplarily illustrated in FIG. 8.

Figure 8:
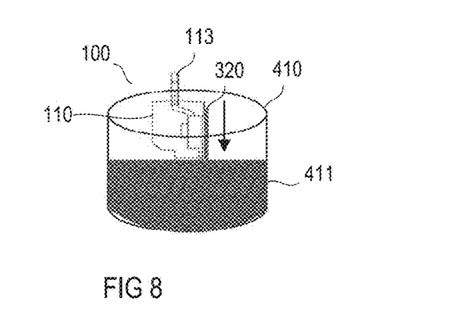
FIG. 8 schematically illustrates one example of an electrophoretic deposition process.

FIG. 8 illustrates a semiconductor component 100 with a semiconductor package no that is immersed into the solution or suspension 411 in the container 410. Although the arrow in FIG. 8 indicates that the semiconductor component 100 is being immersed into the solution 411, a first layer 320 is illustrated on an outer surface of the semiconductor package 110. The first layer 320 may be formed on an electrically conductive surface of the semiconductor component 100 during the EPD process.

Again referring to FIG. 6, a first layer 320 is formed on the outer surface of the semiconductor package 110 by depositing the first material 300 and, after depositing the first material 300, in a second step depositing a second material 310 on the first material 300 or on a pre-layer formed by the first material 300. The second material 310 may be a thermally conductive material with or without fillers. For example, the second material 310 may be or may include a polymer. The polymer may be an epoxy or a silicon based polymer. The polymeric material may be a soft polymeric material (flexible type polymer) or the polymeric material may be hardened. The second material 310 may be provided in the form of droplets or platelets, for example. The second step may comprise an electrophoretic deposition process, as has been described above with respect to the first step, or a dispensing method, for example.

Figure 9:
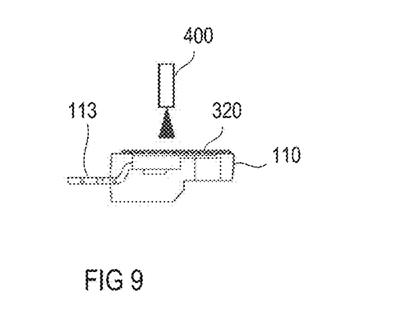
FIG. 9 schematically illustrates an example of a dispensing process.

The general principle of such a dispensing method is schematically illustrated in FIG. 9. Instead of a dispensing method as is illustrated in FIG. 9, an electrostatic spraying method may be used, for example. During a dispensing or electrostatic spraying method, a liquid flow emerging from a tip or thin tube 400 under the influence of a strong electric field breaks up into small droplets due to a charging of the dielectric liquid. If a polymer material is dissolved in the liquid, this technique may be utilized to produce a polymer layer on an electrode. In the example of FIG. 9, the electrode is formed by the electrically conductive surface 140 with the first pre-layer 320 (formed in step 1) deposited thereon. As has been described with reference to FIG. 6, the at least one pin or lead 113 of the semiconductor component 100 may be coupled to a power supply. Instead of a wet solution that is broken up into small droplets, it is also possible to apply a dry powder including the second material 310, for example a polymer, to the first material 300 or the first pre-layer. The particles in the dry powder may be electrically charged and may be attracted by the electrically conductive surface 140 when coupled to a power supply. The charged particles in the liquid or the powder are initially projected towards the electrically conductive surface 140 and may be accelerated towards the electrically conductive surface 140 by an electrostatic charge provided by the power supply. Depending on the charge of the particles, the electrically conductive surface 140 may be coupled to the positive (negatively charged particles) or the negative terminal (positively charged particles) of the power supply.

A polymer may alternatively be deposited on the electrically conductive surface 140 using a polymer coating process or so-called e-coating method. Polymer coating processes generally include extrusion/dispersion coating or solution application techniques, for example. E-coating methods include immersing the electrically conductive surface in a bath that consists of a water-based solution, for example. An electric current is then used to attract the particles that are suspended in the liquid solution and deposit them onto the surface of the substrate. The e-coating, therefore, is very similar to the electrophoretic deposition.

After completing the second step, the first layer 320 includes both the first material 300 and the second material 310. In some examples the first step is followed by a sintering process before performing the second step. Such a sintering process, however, is optional. Sintering generally is the process of compacting and forming a solid mass of material by applying heat or pressure, without melting the material to the point of liquefaction. The sintering may enhance properties such as strength and thermal conductivity, for example. If the first material includes ceramic, the sintering process at a high temperature may fuse the ceramic particles together.

Figure 10A:
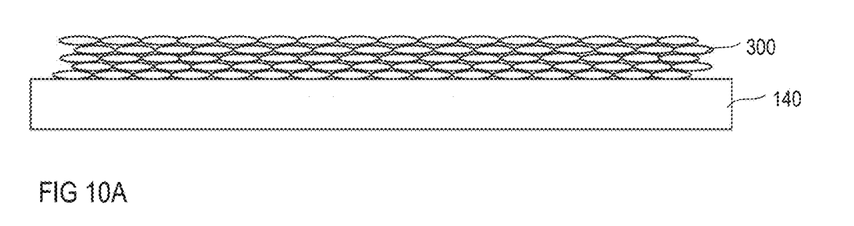
Figure 10B:
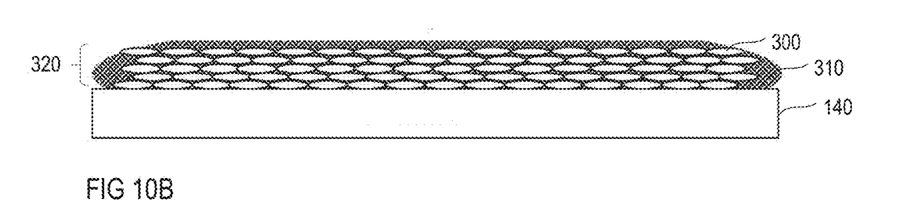

Referring to FIG. 10, an example of a method for producing a semiconductor component 100 is illustrated. In a first step, illustrated in FIG. 10A, a first material 300 is deposited on an electrically conductive surface 140. The first step may comprise an electrophoretic deposition process, as has been described with respect to FIG. 6. An optional sintering step may follow (not illustrated in FIG. 10). In a second step, illustrated in FIG. 10B, a second material 310 is deposited on the first material 300 already arranged on the electrically conductive surface 140. The second step may comprise an electrophoretic deposition process or a dispensing method, as has been described with respect to FIG. 6 above. The second material 310 may be deposited on the surface of a pre-layer that is formed by the first material 300. However, as this pre-layer includes droplets or platelets of the first material 300, the pre-layer may be porous with empty spaces or cavities between the separate droplets or platelets (as illustrated in FIG. 10A), the second material 310 may at least partially fill the empty spaces or cavities of the porous pre-layer between the droplets or platelets of the first material 300, as is schematically illustrated in FIG. 10B.

Figure 10C:
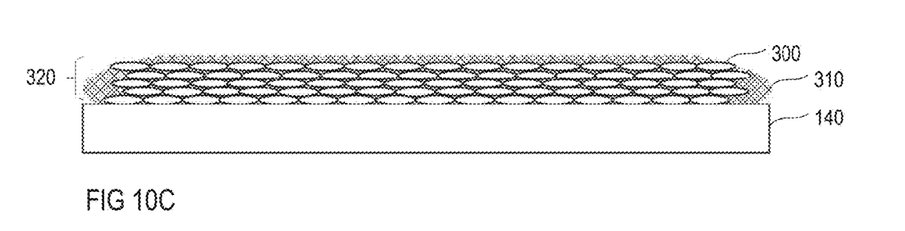

The first material 300 may be or may include hexagonal boron nitride. The deposited first material 300 may form a hexagonal boron nitride pre-layer on the electrically conductive surface 140. The second material 310 may be or may include a polymer and form a polymer coating on the first material 300. The resulting first layer 320 comprises the first material 300 as well as the second material 310. The second step may optionally be followed by a third step during which the first layer 320 comprising the first material 300 and the second material 310 is exposed to a vacuum and/or high temperatures. The temperatures may be room temperature (typically between 20° C. and 25° C.), up to 100° C., up to 150° C., up to 200° C. or up to 500° C., for example. The third step is exemplarily illustrated in FIG. 10C. While heating and/or exposing the first layer 320 to a vacuum, the first layer 320 may be polymerized. Generally, during polymerization monomer molecules are reacted together in a chemical reaction to form polymer chains or three-dimensional networks. There are generally many forms of polymerization. During this third polymerization step, the first material 300 (e.g., hexagonal boron nitride) may be cross-linked with the second material 310 (e.g., polymer). The first material 300 may be, so to speak, held in place by the second material 310. The structure of the first material 300 and/or the second material 310 may be altered during the third step, as is schematically illustrated in FIG. 10C. In particular, the connections between the first material 300 and the second material 310 may be altered. This may provide very good mechanical properties to the first layer 320.

The first layer 320 may have a mass fraction of >90 wt % and provide a dense layer 320 of boron nitride and polymer on the electrically conductive surface 140. When high temperatures are used, a sintered boron nitride layer may be formed on the electrically conductive surface 140. The suspension that is used during the first electrophoretic deposition process may be water based, and may include a binder (e.g., cationic binder, anionic binder or uncharged binder) on a 0.1-60 wt % BN weight basis, for example. The electropohoretic deposition process using an aqueous based solution for depositing a hexagonal boron nitride filler on the electrically conductive surface 140 may be followed by a polymer coating step. For example, a method may comprise an EPD (electropohoretic deposition process) boron nitride deposition followed by (i) conformal coating (dispensing or dipping), (ii) α-coating, or (iii) sintering. If options (i) or (ii) are used, an electrically isolating but thermally conductive (ceramic) layer may be formed on the electrically conductive surface 140. If option (iii) is used, a sensor coating, corrosion protection and/or mould realizing coating may be formed on the thermally conductive surface 140.

The thickness of an electrically non-conducting thin ceramic layer of hexagonal boron nitride may be in the range of about 1-20 μm, 20-40 μm, 40-100 μm or 100-300 μm, for example. A ceramic layer of hexagonal boron nitride of such a thickness may provide electrical isolation for voltages from about 0.1-10 kV/s. Generally, the electrical isolation depends on the thickness of the first material 300 (e.g., ceramic) deposited on the outer surface of the semiconductor, the first material 300 being coated by the second material 310 (e.g., polymer). A thermal conductivity of about 2 W/mK, 10 W/mK or 20 W/mK may be achieved with the proposed solution, for example.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method comprising:
forming a first thermally conductive layer on an outer surface of a semiconductor package, wherein forming the first thermally conductive layer comprises:
depositing a first material on the outer surface of the semiconductor package; and
depositing a second material on the first material after depositing the first material, wherein depositing the second material on the first material comprises at least one of an electrophoretic deposition process, an e-coating process, a dispensing method, an electrostatic spraying method or a dipping method.

2. The method of claim 1, wherein
forming the first thermally conductive layer comprises the electrophoretic deposition process.

3. The method of claim 1, wherein depositing the first material comprises forming a porous pre-layer on the outer surface of the semiconductor package.

4. The method of claim 1, wherein depositing the first material comprises an electrophoretic deposition process.

5. The method of claim 1, wherein the first material comprises at least one of the following:
boron nitride,
aluminum oxide,
silicon carbide,
silicon dioxide, or
a ceramic material including an oxide or nitride combination.

6. The method of claim 1, wherein the second material comprises a thermally conductive material with or without fillers or a polymer.

7. The method of claim 1, further comprising: after depositing the first material, sintering the first material.

8. The method of claim 1, after depositing the second material further comprising at least one of:
heating the first and the second material; or exposing the first and the second material to a vacuum.

9. The method of claim 1, wherein the first material deposited on the outer surface of the semiconductor package has a first thickness, and wherein the thermal conductivity of the first thermally conductive layer is dependent on the first thickness.

10. The method of claim 1, wherein the outer surface of the semiconductor package comprises an electrically conductive surface.

11. The method of claim 1, wherein the first thermally conductive layer formed on the outer surface of the semiconductor package is configured to be mounted to an external heat sink.

12. The method of claim 3, wherein the porous pre-layer comprises cavities and depositing the second material on the first material comprises at least partially filling the cavities of the pre-layer.

13. The method of claim 10, wherein the electrically conductive surface is a heat sink or a die pad of the semiconductor package.

14. The method of claim 10, wherein forming the first thermally conductive layer comprises applying a direct current to the electrically conductive surface.

15. A semiconductor component, comprising:
a semiconductor package with an outer surface; and
a first thermally conductive layer arranged on the outer surface of the semiconductor package,
wherein the first thermally conductive layer comprises a first material comprising a porous pre-layer disposed on the outer surface of the semiconductor package and a second material disposed over first material.

16. The semiconductor component of claim 15, wherein the first material comprises at least one of the following
boron nitride, aluminum oxide, silicon carbide, silicon dioxide, or
a ceramic material including an oxide or a nitride combination.

17. The semiconductor component of claim 15, wherein the second material comprises:
a thermally conductive material with or without fillers; or
a polymer.

18. The semiconductor component of claim 15, wherein the outer surface comprises an electrically conductive surface.

19. The semiconductor component of claim 15, wherein the semiconductor component with the first thermally conductive layer arranged thereon is configured to be mounted to an external heat sink such that the first thermally conductive layer faces the external heat sink.

20. The semiconductor component of claim 15, wherein the porous pre-layer comprises cavities and the second material at least partially fills the cavities of the porous prelayer.

21. The semiconductor component of claim 18, wherein the electrically conductive surface is a heat sink or a die pad of the semiconductor component.

* * * * *